United States Patent
Mori

(10) Patent No.: US 7,454,226 B2
(45) Date of Patent: Nov. 18, 2008

(54) COMMUNICATION TERMINAL

(75) Inventor: Atsuya Mori, Tokyo (JP)

(73) Assignee: Sony Ericsson Mobile Communications Japan, Inc., Tokyo (JP)

(*) Notice: Subject to any disclaimer, the term of this patent is extended or adjusted under 35 U.S.C. 154(b) by 676 days.

(21) Appl. No.: 11/059,907

(22) Filed: Feb. 17, 2005

(65) Prior Publication Data

US 2005/0192043 A1 Sep. 1, 2005

(30) Foreign Application Priority Data

Feb. 18, 2004 (JP) ............... P2004-041967

(51) Int. Cl.
*H04B 7/00* (2006.01)
(52) U.S. Cl. ............... 455/522; 455/69; 455/127.1; 455/127.2; 370/342; 370/345
(58) Field of Classification Search ........... 455/522, 455/69, 127.1, 127.2; 370/342, 345
See application file for complete search history.

(56) References Cited

U.S. PATENT DOCUMENTS

| 5,196,808 | A | | 3/1993 | Pickett et al. | |
|---|---|---|---|---|---|
| 5,287,555 | A | * | 2/1994 | Wilson et al. | 455/115.1 |
| 5,376,895 | A | * | 12/1994 | Aihara | 330/129 |
| 5,745,016 | A | * | 4/1998 | Salminen | 333/17.1 |
| 6,034,952 | A | * | 3/2000 | Dohi et al. | 370/335 |
| 6,038,432 | A | * | 3/2000 | Onoda | 455/127.2 |
| 6,430,402 | B1 | * | 8/2002 | Agahi-Kesheh | 455/115.3 |
| 6,556,815 | B1 | | 4/2003 | Shibamura | |
| 7,103,029 | B1 | * | 9/2006 | Minowa | 370/342 |
| 2003/0114182 | A1 | * | 6/2003 | Chan et al. | 455/525 |
| 2004/0180686 | A1 | | 9/2004 | Nakayama | |

FOREIGN PATENT DOCUMENTS

| EP | 1 478 095 | 11/2004 |
|---|---|---|
| JP | 10 173548 | 6/1998 |
| JP | 11 88226 | 3/1999 |
| WO | WO 03 055084 | 7/2003 |
| WO | WO 03 071694 | 8/2003 |

* cited by examiner

*Primary Examiner*—Sanh D Phu
(74) *Attorney, Agent, or Firm*—Frommer Lawrence & Haug LLP; William S. Frommer; Thomas F. Presson

(57) ABSTRACT

A system and method that detects an APC control abnormality during transmission power control to prevent circuitry from becoming faulty or damaged and eliminates the need for a pre-shipment process. A cellular phone terminal provides transmission power control. A CPU in the cellular phone terminal generates a predicted transmission power value corresponding to the power value to be transmitted through transmission power control, and compares the predicted transmission power value against a detection output value, which is obtained when a wave detector detects a transmission signal generated from a power amplifier. If the result of comparison indicates that the difference between the predicted transmission power value and detection output value is not smaller than a predetermined value, the CPU halts a signal transmission process.

5 Claims, 2 Drawing Sheets

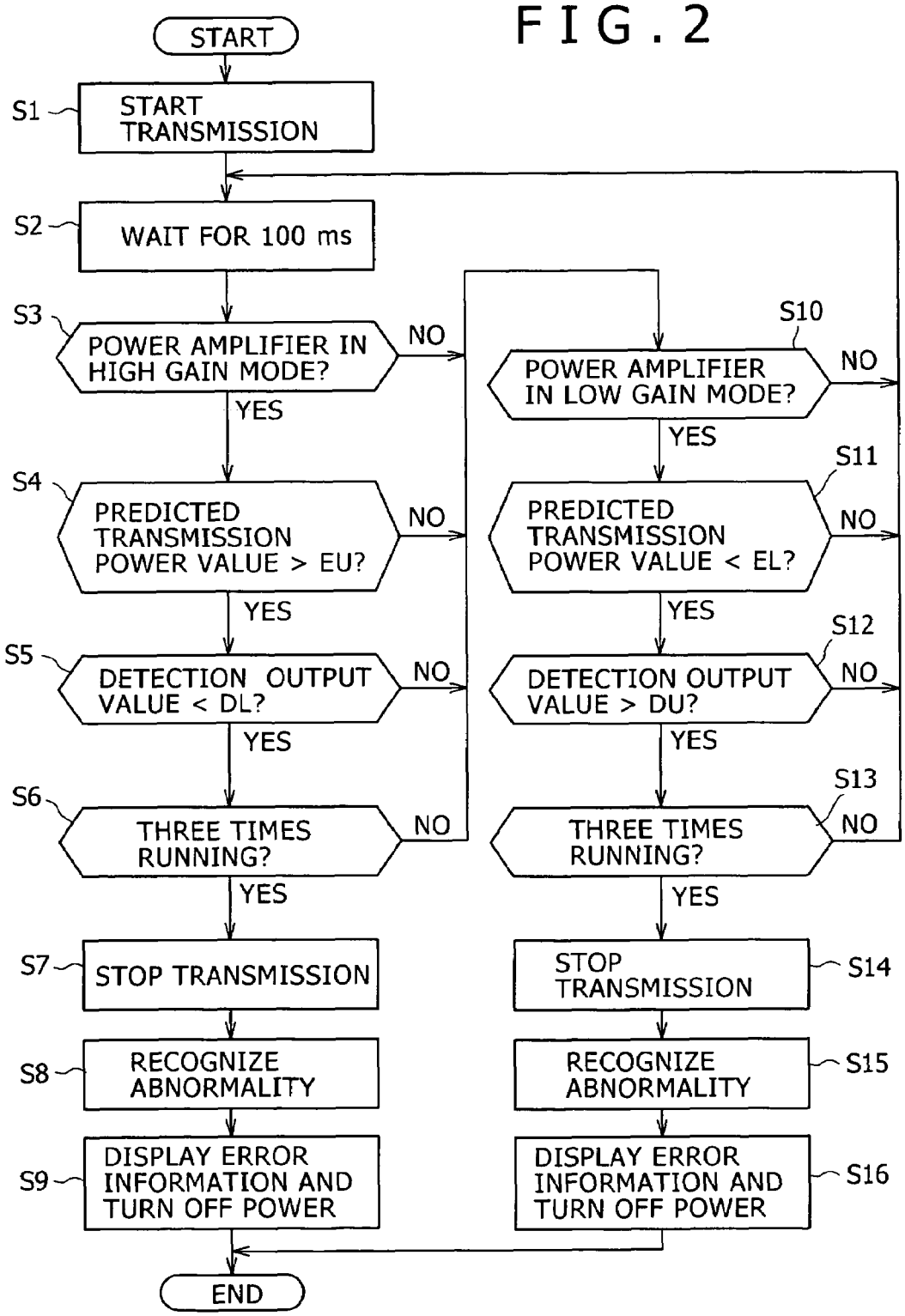

COMMUNICATION TERMINAL

BACKGROUND OF THE INVENTION

The present invention relates to a communication terminal for exercising transmission power control, which is employed, for instance, for a CDMA (Code Division Multiple Access) communication system.

In the CDMA communication system, for example, adaptive transmission power control is exercised to minimize the transmission power during a signal transmission/reception between a cellular phone terminal and a base station and maintain the strength of a radio wave received by the base station at a certain level. Particularly, recently released cellular phone terminals incorporate an APC (Auto Power Control) circuit in order to provide transmission power control for the CDMA communication system with high accuracy. The APC circuit receives a transmission output from a transmission power amplifier, converts the received transmission output to a voltage value (detection output value) with a wave detector, and exercises control to ensure that the transmission power coincides with a desired expected value. More specifically, if the detection output value is smaller than the expected value of the transmission power, the APC circuit exercises control so as to increase a transmission power value. If, on the contrary, the detection output value is greater than the expected value of the transmission power, the APC circuit exercises control so as to decrease the transmission power value.

The technology disclosed by Japanese Patent Laid-open No. Hei 10-173548 (Patent Document 1) defines the relationship between the AGC (Automatic Gain Control) voltage of a transistor IC in a transmission circuit and the detection output for APC control prior, for instance, to shipment, determines a threshold value for the AGC control voltage and a threshold value for the detection output for APC control in accordance with the defined relationship, stores the threshold values in memory, and notes the detection output value, AGC control voltage value, and threshold values stored in memory during an actual communication to judge whether APC control is normally exercised. If APC control is abnormally exercised, the disclosed technology stops a transmission process to prevent the circuit from being rendered faulty or damaged.

It is known that communication failure or circuit destruction may occur if, for instance, the detection output value is abnormal while the above APC control is exercised. More specifically, when the detection output value remains, for instance, small due to an amplifier failure or other circuit abnormality, the above APC control is exercised to continuously increase the transmission power. An excessive input then enters the transmission power amplifier so that in the worst case, the circuit would become damaged. If, on the contrary, the detection output value remains great due to circuit board short-circuiting or other circuit abnormality, the above APC control is exercised to continuously decrease the transmission power. This eventually incurs a communication breakdown.

The technology disclosed by Patent Document 1 can check for an abnormal APC control operation in accordance with the AGC control voltage value and detection output value for actual communication and the threshold values stored in memory. If any abnormal APC control operation is recognized, the disclosed technology can stop a transmission process to prevent the circuit from becoming faulty or damaged.

However, the technology disclosed by Patent Document 1 has to define the relationship between the AGC control voltage and the detection output for APC control on an individual cellular phone terminal basis prior, for instance, to shipment, and determine a threshold value for the AGC control voltage and a threshold value for the detection output for APC control in accordance with the defined relationship. It means that the threshold values vary with the circuit characteristics of each cellular phone terminal. It is therefore necessary to determine the threshold values for each cellular phone terminal and store the determined threshold values in memory or otherwise prior to shipment. The technology disclosed by Patent Document 1 is not favorable because it reduces productivity significantly and incurs a production cost increase.

SUMMARY OF THE INVENTION

The present invention has been made in view of the above circumstances, and provides a communication terminal that is capable of detecting an abnormal APC control operation for transmission power control to prevent circuitry from becoming faulty or damaged and providing productivity improvement and production cost reduction, for instance, by eliminating the need for a pre-shipment process for threshold value adjustment.

The communication terminal according to the present embodiment exercises transmission power control to maintain the strength of a radio wave received by a base station at a certain level when wireless communication is to be established with the base station. To solve the above-mentioned problems, the communication terminal includes a predicted transmission power value generation section for generating a predicted transmission power value, which corresponds to the power value to be transmitted through transmission power control; a detection value generation section for generating a detection value for the transmission signal to be output from an antenna; and a control section for comparing the predicted transmission power value and detection value and halting a signal transmission operation if the difference between the predicted transmission power value and detection value is not smaller than a predetermined value.

The predicted transmission power value according to the present invention can be determined from the power value to be transmitted through transmission power control. It represents information that remains effective without having to reflect the circuit characteristics differences between communication terminals. Therefore, the above-mentioned predetermined value, which is to be compared against the difference between the predicted transmission power value and detection value, can be equal for all communication terminals.

The communication terminal according to the present invention compares the predicted transmission power value, which corresponds to the power value to be transmitted through transmission power control, against the detection value of the transmission signal. If the result of comparison indicates that the difference between the predicted transmission power value and the detection value is not smaller than a predetermined value, the communication terminal halts a signal transmission process to detect an APC control abnormality for transmission power control and prevent circuitry from becoming faulty or damaged. Further, the communication terminal according to the present invention provides productivity improvement and production cost reduction, for instance, by eliminating the need for a pre-shipment process for threshold value adjustment.

BRIEF DESCRIPTION OF THE DRAWINGS

FIG. 2 is a flowchart illustrating an operation that the cellular phone terminal according to one embodiment of the present invention performs to detect an APC control abnormality during transmission power control and prevent circuitry from becoming faulty or damaged.

DETAILED DESCRIPTION OF THE PREFERRED EMBODIMENTS

Figure 1:
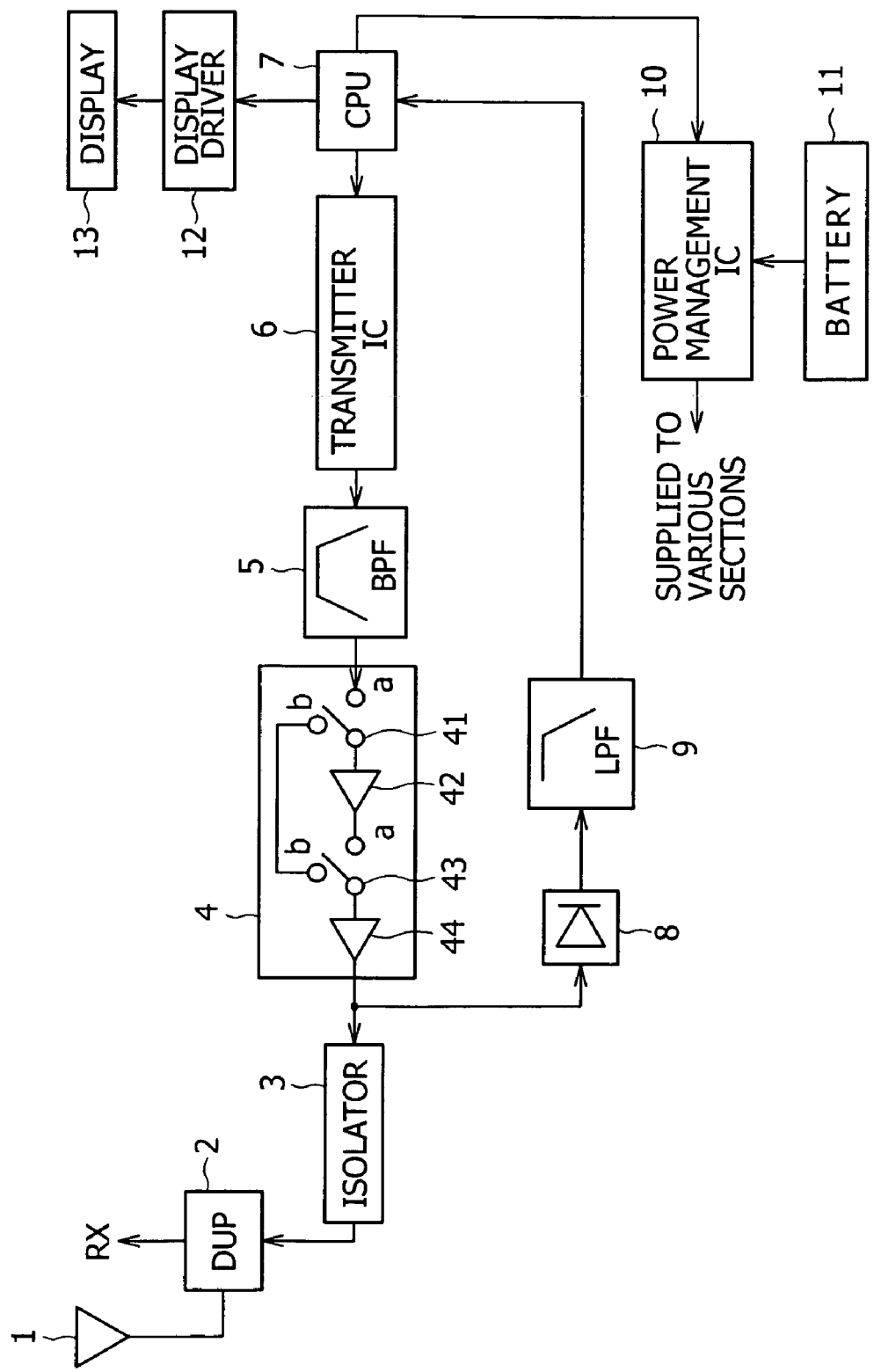
FIG. 1 is a block diagram that schematically illustrates the essential part of a cellular phone terminal according to one embodiment of the present invention.

One embodiment of a communication terminal according to the present invention will now be described with reference to the accompanying drawings. Although the description of the present embodiment relates to a cellular phone terminal conforming to the CDMA communication system, it is to be considered in all respects only as illustrative and not restrictive. The present invention is not limited to the present embodiment.

[Transmission System Circuit Configuration]

FIG. 1 shows the circuit configuration of a transmission system, which constitutes an essential part of the cellular phone terminal according to the present embodiment. The circuit configuration of a reception system is not illustrated in FIG. 1 because it is the same as for common CDMA cellular phone terminals. Further, the reception system is excluded from the description of the present embodiment.

Referring to FIG. 1, transmission data is output from a CPU 7 and then delivered to a transmitter IC 6. The transmitter IC 6 generates a transmission signal by modulating a carrier wave with the transmission data, subjects the transmission signal to a gain adjustment process, which is performed by an AGC circuit (not shown), and outputs the adjusted transmission signal. The CPU 7 controls the gain adjustment process that is performed by the AGC circuit within the transmitter IC 6.

The transmission signal derived from a modulation process that is performed by the transmitter IC 6 is forwarded to a bandpass filter 5, which passes signals that are within a certain transmission frequency band. The transmission signal output from the bandpass filter 5 is delivered to a power amplifier 4.

The power amplifier 4 provides a high gain mode and a low gain mode. These modes are selected when switches 41 and 43 variously select amplifiers 42 and 44. More specifically, when switches 41 and 43 are both set to selection terminals a to select the high gain mode, amplifiers 42 and 44 operate to provide two stages of amplification. When, on the other hand, switches 41 and 43 are both set to selection terminals b to select the low gain mode, only amplifier 44 operates to provide one stage of amplification. Selection control over switches 41 and 43 is exercised, for instance, by the CPU 7. The CPU 7 exercises selection control over switches 41 and 43 depending on whether the high gain mode or low gain mode is used for transmission power control.

The transmission signal output from the power amplifier 4 is forwarded to an isolator 3, and then delivered to an antenna 1 via a duplexer 2. This causes the antenna 1 to output a transmission wave.

A display driver 12 drives a display 13 in accordance with a display signal that is supplied from the CPU 7. Error information and other items of information then appear on the display 13 as described later.

A power management IC 10 supplies electrical power from a battery 11 to various sections. As described later, the power management IC 10 is also capable of automatically shutting off the power supply to various sections under control of the CPU 7.

Referring to FIG. 1, the transmission signal output from the power amplifier 4 is also forwarded to a wave detector 8, which functions as the detection value generation section according to the present invention. The wave detector 8 detects the input transmission signal and outputs its detection voltage. The detection voltage output from the wave detector 8 (hereinafter referred to as the detection output value) is sent to a lowpass filter 9 to eliminate high frequency components, and then delivered to the CPU 7.

In other words, an APC circuit is formed within the configuration shown in FIG. 1 to feed the output of the power amplifier 4 back to the CPU 7 via the wave detector 8 and lowpass filter 9. In addition to the gain adjustment made by the AGC circuit within the transmitter IC 6, high-precision transmission power control is exercised by the APC circuit. More specifically, the CPU 7 recognizes the transmission power value to be transmitted by the local cellular phone terminal as a predicted transmission power value. If the detection output value of the wave detector 8 is greater than the predicted transmission power value, control is exercised to decrease the transmission power value. If, on the contrary, the detection output value is smaller than the predicted transmission power value, control is exercised to increase the transmission output. In short, the CPU 7 provides APC control in accordance with the difference between the predicted transmission power value and detection output value.

[Operation Performed Upon Abnormality Detection]

The cellular phone terminal according to the present embodiment performs a process as indicated in a flowchart in FIG. 2 for the purpose of detecting an APC control abnormality during transmission power control and preventing circuitry from becoming faulty or damaged. In other words, the CPU 7 of the cellular phone terminal according to the present embodiment incorporates a predicted transmission power value generation section and a control section to exercise its functions. The predicted transmission power value generation section generates a predicted transmission power value that corresponds to the power value to be transmitted through transmission power control according to the present invention. The control section compares the predicted transmission power value and detection output value, and halts a signal transmission process if the difference between the predicted transmission power value and detection output value is greater than a predetermined value.

Referring to FIG. 2, a signal transmission process starts in step S1. In step S2, the CPU 7 waits (e.g., for 100 ms) until the transmission power stabilizes, and then proceeds to step S3.

In step S3, the CPU 7 judges whether the power amplifier 4 is in the high gain mode. If the power amplifier 4 is in the high gain mode, the CPU 7 proceeds to step S4. If, on the other hand, the power amplifier 4 is not in the high gain mode, the CPU 7 proceeds to step S10.

In step S10, the CPU 7 judges whether the power amplifier 4 is in the low gain mode. If the power amplifier 4 is in the low gain mode, the CPU 7 performs step S11. If, on the other hand, the power amplifier 4 is not in the low gain mode, the CPU 7 returns to step S2.

In step S4, the CPU 7 compares the predicted transmission power value in the high gain mode for transmission power control against a stored, predetermined high gain predicted upper limit threshold value EU.

In the present embodiment, the high gain predicted upper limit threshold value EU is predetermined and stored in memory or otherwise. This value is to be compared against the predicted transmission power value in the high gain mode for transmission power control. In other words, the high gain predicted upper limit threshold value EU is a threshold value for the predicted transmission power value for transmission power control. Therefore, the high gain predicted upper limit threshold value EU need not be determined variously for all cellular phone terminals prior, for instance, to shipment (namely, the high gain predicted upper limit threshold value EU does not depend on the circuit characteristics of individual cellular phone terminals) unlike a threshold value that is disclosed by Patent Document 1, which is mentioned earlier, and determined in accordance with the relationship between the AGC control voltage and APC control detection output. It means that the high gain predicted upper limit threshold value EU remains effective without having to reflect the circuit characteristics differences between cellular phone terminals. Therefore, the same high gain predicted upper limit threshold value EU can be set for all cellular phone terminals. As a result, it is possible to improve the productivity and minimize the cost of cellular phone terminals.

If the CPU 7 judges in step S4 that the predicted transmission power value is greater than the high gain predicted upper limit threshold value EU, the program flow proceeds to step S5. If, on the other hand, the CPU 7 judges that the predicted transmission power value is not greater than the high gain predicted upper limit threshold value EU, the program flow proceeds to step S10.

In step S5, the CPU 7 compares the detection output value against a stored, predetermined high gain detection lower limit threshold value DL. The present embodiment also permits the same high gain detection lower limit threshold value DL to be set for all cellular phone terminals. It should also be noted that the high gain predicted upper limit threshold value EU is greater than the high gain detection lower limit threshold value DL. The difference between the values EU and DL is approximately 6 to 7 dB.

If the CPU 7 judges in step S5 that the detection output value is smaller than the high gain detection lower limit threshold value DL, the program flow proceeds to step S6. If, on the other hand, the CPU 7 judges that the detection output value is not smaller than the high gain detection lower limit threshold value DL, the program flow proceeds to step S10.

In step S6, the CPU 7 checks whether query steps S3 through S5 were answered "Yes" due to an unexpected abnormality. More specifically, step S6 is performed to judge whether query steps S3 through S5 are all answered "Yes" three times running. If the CPU 7 judges in step S6 that the query steps were all answered "Yes" three times running, the program flow proceeds to step S7. If, on the other hand, the CPU 7 judges that the query steps were not all answered "Yes" three times running, the program flow proceeds to step S10.

In the present embodiment, therefore, steps S2 through S6 are performed to judge whether the high gain mode prevails, whether the predicted transmission power value is greater than the high gain predicted upper limit threshold value EU, and whether the detection output value is smaller than the high gain detection lower limit threshold value DL. In other words, steps S2 through S6 are performed to judge whether a state where the difference between the predicted transmission power value and detection output value is greater than the difference between the high gain predicted upper limit threshold value EU and high gain detection lower limit threshold value DL is detected three times running at 100 ms intervals.

In step S7, the CPU 7 halts a signal transmission process by stopping the transmission data output to the transmitter IC 6. In step S8, the CPU 7 recognizes that a circuit abnormality exists, and then causes the display 13 to indicate that an error has occurred due to a circuit abnormality (e.g., a power amplifier failure). Next, the CPU 7 controls the power management IC 10 so that the power automatically turns off.

When the program flow proceeds to step S11 after step S10 is completed to find that the low gain mode prevails, the CPU 7 compares the predicted transmission power value in the low gain mode for transmission power control against a stored, predetermined low gain predicted lower limit threshold value EL. As is the case with the high gain predicted upper limit threshold value EU, the present embodiment also permits the same low gain predicted lower limit threshold value EL to be set for all cellular phone terminals.

If the CPU 7 judges in step S11 that the predicted transmission power value is smaller than the low gain predicted lower limit threshold value EL, the program flow proceeds to step S12. If, on the other hand, the CPU 7 judges that the predicted transmission power value is not smaller than the low gain predicted lower limit threshold value EL, the program flow returns to step S2.

In step S12, the CPU 7 compares the detection output value against a stored, predetermined low gain detection upper limit threshold value DU. The present embodiment also permits the same low gain detection upper limit threshold value DU to be set for all cellular phone terminals. It should also be noted that the low gain predicted lower limit threshold value EL is smaller than the low gain detection upper limit threshold value DU. The difference between the values EL and DU is approximately 6 to 7 dB.

If the CPU 7 judges in step S12 that the detection output value is greater than the low gain detection upper limit threshold value DU, the program flow proceeds to step S13. If, on the other hand, the CPU 7 judges that the detection output value is not greater than the high gain detection lower limit threshold value DL, the program flow returns to step S2.

In step S13, the CPU 7 checks whether query steps S11 and S12 were answered "Yes" due to an unexpected abnormality. More specifically, step S13 is performed to judge whether query steps S11 and S12 are all answered "Yes" three times running. If the CPU 7 judges in step S13 that the query steps were all answered "Yes" three times running, the program flow proceeds to step S14. If, on the other hand, the CPU 7 judges that the query steps were not all answered "Yes" three times running, the program flow returns to step S2.

In the present embodiment, therefore, step S2 and steps S10 through S13 are performed to judge whether the low gain mode prevails, whether the predicted transmission power value is smaller than the high gain predicted lower limit threshold value EL, and whether the detection output value is greater than the high gain detection upper limit threshold value DU. In other words, step S2 and steps S10 through S13 are performed to judge whether a state where the difference between the predicted transmission power value and detection output value is greater than the difference between the low gain predicted lower limit threshold value EL and low gain detection upper limit threshold value DU is detected three times running at 100 ms intervals.

In step S14, the CPU 7 halts a signal transmission process by stopping the transmission data output to the transmitter IC 6. In step S15, the CPU 7 recognizes that a circuit abnormality exists, and then causes the display 13 to indicate that an error has occurred due to a circuit abnormality (e.g., a circuit board short circuit) Next, the CPU 7 controls the power management IC 10 so that the power automatically turns off.

SUMMARY OF EMBODIMENTS

As described above, the cellular phone terminal according to the present embodiment can recognize a circuit abnormality by comparing the predicted transmission power value and detection output value for transmission power control against their respective predetermined threshold values. When a circuit abnormality is recognized, the cellular phone terminal according to the present embodiment can avoid cellular phone terminal destruction and other secondary damage by turning off the power. In the present embodiment, the predicted transmission power value and detection output value are to be compared against threshold values. The predicted transmission power value and detection output value both remain effective without having to reflect the circuit characteristics differences between cellular phone terminals. Therefore, the same values can be set for all cellular phone terminals. Consequently, threshold value adjustments need not be variously made for all cellular phone terminals prior, for instance, to shipment. As a result, it is possible to improve the productivity of cellular phone terminals, minimize their cost, and yield increased memory savings. Further, the CPU according to the present embodiment performs simple processing operations such as comparison and power supply control. Therefore, the load on the CPU can be minimized.

While the present invention has been described in terms of a single preferred embodiment, those skilled in the art will recognize that the invention is not limited to the preferred embodiment, and that various design modifications and other changes may be made to the preferred embodiment without departing from the spirit and scope of the invention.

For example, steps S9 and S16, which are shown in FIG. 2, are performed to shut off the entire power supply to the cellular phone terminal. However, an alternative is to shut off the power supply to the transmission system components only and keep the other components energized. In such an alternative case, the functions irrelevant to signal transmission are continuously available.

The present invention is not only applicable to cellular phone terminals but also applicable to various apparatuses having a transmission section for providing transmission power control, such as PDAs (Personal Digital Assistants) and personal computers having a communication function.

What is claimed is:

1. A communication terminal for exercising transmission power control to maintain the strength of a radio wave received by a base station at a certain level when wireless communication is to be established with the base station, the communication terminal comprising:
    a predicted transmission power value generation section for generating a predicted transmission power value, which corresponds to the power value to be transmitted through transmission power control;
    a detection value generation section for generating a detection value for the transmission signal to be output from an antenna;
    a gain mode selection section for selecting a high gain mode or a low gain mode; and
    a control section for comparing said predicted transmission power value and said detection value and halting a signal transmission operation if the difference between said predicted transmission power value and said detection value is not smaller than a predetermined value,
    wherein when the high gain mode is selected, the control section compares the predicted transmission power value with a first threshold value, and compares the detection value with a second threshold value, which is smaller than said first threshold value, and
    wherein when the low gain mode is selected, the control section compares the predicted transmission power value with a third threshold value, and compares the detection value with a fourth threshold value, which is greater than said third threshold value.

2. The communication terminal according to claim 1, wherein, when said predicted transmission power value is greater than the first threshold value and said detection value is smaller than the second threshold value, said control section concludes that the difference between said predicted transmission power value and said detection value is not smaller than a predetermined value.

3. The communication terminal according to claim 1, wherein, when said predicted transmission power value is smaller than the third threshold value and said detection value is greater than the fourth threshold value, said control section concludes that the difference between said predicted transmission power value and said detection value is not smaller than a predetermined value.

4. The communication terminal according to claim 1, further comprising:
    a power supply section for supplying power to various sections,
    wherein, after said signal transmission operation is halted, said control section controls said power supply section to stop supplying power to various sections.

5. The communication terminal according to claim 1, wherein said control section halts said signal transmission operation when a state where the difference between said predicted transmission power value and said detection value is not smaller than a predetermined value is encountered a predetermined number of consecutive times at fixed time intervals.

* * * * *